(12) United States Patent
Cideciyan et al.

(10) Patent No.: US 8,854,759 B2
(45) Date of Patent: Oct. 7, 2014

(54) COMBINED SOFT DETECTION/SOFT DECODING IN TAPE DRIVE STORAGE CHANNELS

(75) Inventors: Roy D. Cideciyan, Rueschlikon (CH); Robert A. Hutchins, Tuscon, AZ (US); Thomas Mittelholzer, Zurich (CH); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 13/454,935

(22) Filed: Apr. 24, 2012

(65) Prior Publication Data

US 2013/0279040 A1 Oct. 24, 2013

(51) Int. Cl.
*G11B 5/09* (2006.01)

(52) U.S. Cl.
USPC .............................. 360/53; 714/780; 714/795

(58) Field of Classification Search
USPC ............ 360/31, 39, 46, 51, 53; 714/794, 795, 714/780, 755
See application file for complete search history.

(56) References Cited

U.S. PATENT DOCUMENTS

| | | | |
|---|---|---|---|
| 4,888,775 A | 12/1989 | Karabed et al. | |
| 6,757,122 B1 * | 6/2004 | Kuznetsov et al. | 360/53 |
| 6,895,547 B2 | 5/2005 | Eleftheriou et al. | |
| 6,901,119 B2 | 5/2005 | Cideciyan et al. | |
| 6,907,506 B2 | 6/2005 | Proidl | |
| 7,000,167 B2 | 2/2006 | Coker et al. | |
| 7,071,851 B1 | 7/2006 | Blaum et al. | |
| 7,246,294 B2 | 7/2007 | Kauschke et al. | |
| 7,266,750 B1 | 9/2007 | Patapoutian et al. | |
| 7,405,678 B2 | 7/2008 | Cherubini | |
| 7,409,622 B1 * | 8/2008 | Lu et al. | 714/755 |
| 7,486,208 B2 | 2/2009 | Cideciyan et al. | |
| 7,530,003 B2 | 5/2009 | Lee et al. | |
| 7,616,134 B1 | 11/2009 | Mittelholzer | |
| 7,650,561 B1 | 1/2010 | Ulriksson et al. | |
| 7,679,535 B2 | 3/2010 | Cideciyan et al. | |
| 7,725,800 B2 | 5/2010 | Yang et al. | |
| 7,827,464 B2 | 11/2010 | Kuznetsov et al. | |
| 7,873,894 B2 | 1/2011 | Eleftheriou et al. | |

(Continued)

FOREIGN PATENT DOCUMENTS

| | | |
|---|---|---|
| JP | 8098144 A | 4/1996 |
| JP | 2001067813 A | 3/2001 |

(Continued)

OTHER PUBLICATIONS

Benedetto et al., "A Soft-Input Soft-Output Maximum A Posteriori (MAP) Module to Decode Parallel and Serial Concantenated Codes," TDA Progress Report 42-127, Nov. 15, 1996, pp. 1-20.

(Continued)

*Primary Examiner* — Tan X Dinh
(74) *Attorney, Agent, or Firm* — Zilka-Kotab, PC

(57) ABSTRACT

In one embodiment, a tape drive system includes a soft detector for executing a first forward loop of a detection algorithm on a first block of signal samples during a first time interval; and logic for executing forward and reverse loops during several time intervals; and logic adapted for outputting a first decoded block of signal samples based on the executing the decoding algorithm on the first block during a sixth time interval, wherein a sum of second, third, fourth, fifth, and sixth time intervals are about equal in duration to the first time interval.

22 Claims, 10 Drawing Sheets

(56) References Cited

U.S. PATENT DOCUMENTS

| | | | |
|---|---|---|---|
| 7,877,662 | B2 | 1/2011 | Eleftheriou et al. |
| 8,046,660 | B2 | 10/2011 | Wu et al. |
| 8,049,648 | B2 | 11/2011 | Chaichanavong |
| 8,065,585 | B1 | 11/2011 | Abbaszadeh et al. |
| 2007/0288834 | A1 | 12/2007 | Crozier et al. |
| 2008/0235559 | A1* | 9/2008 | Yang ........................ 714/758 |
| 2009/0235142 | A1 | 9/2009 | Galbraith et al. |
| 2010/0180180 | A1 | 7/2010 | Cideciyan et al. |
| 2010/0241923 | A1 | 9/2010 | Wang et al. |
| 2010/0241925 | A1 | 9/2010 | Wang et al. |
| 2010/0241926 | A1 | 9/2010 | Wang et al. |
| 2010/0268918 | A1 | 10/2010 | Priewasser et al. |
| 2010/0303176 | A1* | 12/2010 | Lilleberg et al. ............. 375/341 |
| 2011/0107187 | A1 | 5/2011 | Gill et al. |
| 2011/0252290 | A1 | 10/2011 | Cideciyan et al. |
| 2013/0283127 | A1 | 10/2013 | Cideciyan et al. |
| 2013/0326305 | A1 | 12/2013 | Cideciyan et al. |
| 2013/0326306 | A1 | 12/2013 | Cideciyan et al. |
| 2013/0326307 | A1 | 12/2013 | Cideciyan et al. |
| 2013/0326311 | A1 | 12/2013 | Cideciyan et al. |

FOREIGN PATENT DOCUMENTS

| | | |
|---|---|---|
| JP | 2008-146828 A | 6/2008 |
| WO | 2008/116725 A1 | 10/2008 |
| WO | 2010/078992 A1 | 7/2010 |

OTHER PUBLICATIONS

Blanksby et al., "A 690-mW 1-Gb/s 1024-b, Rate-½ Low-Density Parity-Check Code Decoder," 2002 IEEE, IEEE Journal of Solid-State Circuits, vol. 37, No. 3, Mar. 2002, pp. 404-412.
Ratnayake et al., "A High-Throughput Maximum a Posteriori Probability Detector," 2008 IEEE, IEEE Journal of Solid-State Circuits, vol. 43, No. 8, Aug. 2008, pp. 1846-1858.
Viterbi, Andrew J., "An Intuitive Justification and a Simplified Implementation of the MAP Decoder for Convolutional Codes," 1998 IEEE, IEEE Journal on Selected Areas in Communications, vol. 16, No. 2, Feb. 1998.
Robertson et al., "Optimal and Sub-Optimal Maximum A Posteriori Algorithms Suitable for Turbo Decoding," European Transactions on Telecommunications, vol. 8, No. 2, pp. 119-125, Mar.-Apr. 1997.
International Search Report and Written Opinion from PCT application No. PCT/CN2013/072908 dated Jun. 27, 2013.
Niktash et al., "RECFEC: A Reconfigurable FEC Processor for Viterbi, Turbo, Reed-Solomon and LDPC Coding," Wireless Communications and Networking Conference, 2008, IEEE, Mar. 31, 2008-Apr. 3, 2008, pp. 605-610.
Costello Jr., Daniel J., "Modern Coding Theory," Coding Research Group, Department of Electrical Engineering, University of Notre Dame, 2009 School of Information Theory, Northwestern University, Aug. 10, 2009, pp. 1-160.
Immink et al., "Codes for Digital Recorders," 1998 IEEE, IEEE Transactions On Information Theory, vol. 44, No. 6, Oct. 1998, pp. 2260-2299.
Immink, Kees a. Schouhamer, "Codes for Mass Data Storage Systems, Second Edition," 2004 Shannon Foundation Publishers, Eindhoven, The Netherlands, www.shannonfoundation.org/book.html, pp. 1-362.
Bliss, W. G., "Circuitry for Performing Error Correction Calculations on Baseband encoded Data to Eliminate Error Propogation," IBM Technical Disclosure Bulletin, vol. 23, Mar. 1981, pp. 4633-4634.
Wijngaarden et al., "Maximum Runlength-Limited Codes with Error Control Capabilities," 2001 IEEE, IEEE Journal on Selected Areas in Communications, vol. 19, No. 4, Apr. 2001, pp. 602-611.
Blaum et al., "High-Rate Modulation Codes for Reverse Concatenation," 2007 IEEE, IEEE Transactions on Magnetics, vol. 43, No. 2, Feb. 2007, pp. 740-743.
Blaum et al., "Enumerative Encoding with Non-Uniform Modulation Constraints," 2007 IEEE, ISIT2007, Nice, France, Jun. 24-Jun. 29, 2007, pp. 1831-1835.

"White Paper Blu-ray Disc Format, 1.A Physical Format Specifications for BD-RE, 3rd Edition," Blu-ray Disc Association, Oct. 2010, pp. 1-42.
"White Paper Blu-ray Disc Format, 1.B Physical Format Specifications for BD-R, 5th Edition," Blu-ray Disc Association, Oct. 2010, pp. 1-39.
"White Paper Blu-ray Disc Format, 1.C Physical Format Specifications for BD-ROM, 6th Edition," Blu-ray Disc Association 2010, pp. 1-48.
Asthana et al., "Rewritable Optical Disk Drive Technology," 1996 IBM, IBM Journal of Research and Development, vol. 40, No. 5, Sep. 1996, pp. 543-558.
Coene et al., "Channel Coding and Signal Processing for Optical Recording Systems Beyond DVD," 2001 IEEE, IEEE Transactions on Magnetics, vol. 37, No. 2, Mar. 2001, pp. 682-688.
Choi, GoangSeog, "The Front-End SOC for a Blu-ray Disc Recorder," 2004 IEEE, IEEE Communications Magazine, Topics in Curcuits for Communications, Dec. 2004, pp. 124-131.
Narahara et al., "Optical Disc System for Digital Video Recording," 2000 Japanese Journal of Applied Physics Publication Board, Japanese Journal of Applied Physics, vol. 39, Part 1, No. 2B, Feb. 2000, pp. 912-919.
Immink, Kees a. Schouhamer, "A Survey of Codes for Optical Disk Recording," 2001 IEEE, IEEE Journal on Selected Areas in Communications, vol. 19, No. 4, Apr. 2001, pp. 756-764.
Mittelholzer et al., "Reverse Concatenation of Product and Modulation Codes," 2008 IEEE, IEEE Communications Society, ICC 2008, pp. 1991-1995.
Mittelholzer, T, "Enumerative Maximum-Transition-Run Codes," 2009 IEEE, ISIT 2009, Seoul, Korea, Jun. 28-Jul. 3, 2009, pp. 1549-1553.
"International Magnetic Tape Storage Technology Roadmap Workshop," INSIC, Information Storage Industry Consortium, Broomfield, CO, USA, Aug. 24-25, 2011, 5 pgs.
Solowiejczyk, Ivy J., "DOTS Technology Introduction," Group 47, LLC, IBM, Jan. 30, 2012, pp. 1-10.
Cideciyan et al., "Maximum Transition Run Codes for Generalized Partial Response Channels," 2001 IEEE, IEEE Journal on Selected Areas in Communications, vol. 19, No. 4, Apr. 2001, pp. 619-634.
Cideciyan et al., "A PRML System for Digital Magnetic Recording," 1992 IEEE, IEEE Journal on Selected Areas in Communications, vol. 10, No. 1, Jan. 1992, pp. 38-56.
Blahut, R.E., "Algebraic Codes for Data Transmission: Ch. 10 Beyond BCH Codes," Cambridge University Press 2003, 8 pages.
International Search Report and Written Opinion from PCT Application No. PCT/EP2013/060100 dated Sep. 16, 2013.
Blaum et al., "Reverse Concatenation with Maximum Transition Run (MTR) Codes for High-Density Perpendicular Recording," 2008 IEEE, Global Telecommunications Conference 2008, Nov. 30, 2008, pp. 1-4.
Sawaguchi et al., "Iterative Decoding for Concatenated Error Correction Coding in PRML Channel Systems," 1999 IEEE, Global Telecommunications Conference—Globecom '99, pp. 749-754.
Fan et al., "Constraint Gain," 2004 IEEE, IEEE Transactions on Information Theory, vol. 50, No. 9, Sep. 2004, pp. 1989-2001.
"QuickSpecs HP StorageWorks LTO Ultrium Tape Drive," Worldwide QuickSpecs—Version 2, Jun. 18, 2010, pp. 1-35.
Karp et al., "IBM TS1140 Tape Drive—Technology, Features and Function Whitepaper," 2011 IBM Corporation, IBM Systems Storage, Oct. 2011, pp. 1-44.
Argumedo et al., "Scaling tape-recording areal densitites to 100 Gb/in2," 2008 IBM, IBM Journal of Research and Development, vol. 52, No. 4/5, Jul./Sep. 2008, pp. 513-527.
Immink et al., "Extremely Efficient DC-Free RLL Codes for Optical Recording," 2001 IEEE, IEEE Transactions on Consumer Electronics, vol. 47, No. 4, Nov. 2001, pp. 910-914.
Sawaguchi et al., "A Concatenated Coding Technique for Partial Response Channels," 2001 IEEE, IEEE Transactions on Magnetics, vol. 37, No. 2, Mar. 2001, pp. 695-703.
Non-Final Office Action from U.S. Appl. No. 13/483,026 dated Apr. 10, 2014.

* cited by examiner

COMBINED SOFT DETECTION/SOFT DECODING IN TAPE DRIVE STORAGE CHANNELS

BACKGROUND

The present invention relates to reading information from tracks in a tape-drive system, and more particularly, to using combined soft detection/soft decoding in storage channels.

Reverse concatenation is a technique used to improve the robustness of tape-drive systems and increase tape cartridge capacity. In this technique, modulation encoding is performed prior to error-correcting code (ECC) encoding, so that the read channel is able to implement ECC decoding prior to modulation-code decoding. This approach allows for the possibility of applying soft ECC decoding techniques because soft reliability information extracted from channel data by a soft detector may be made available to the soft ECC decoder directly. Low-density parity-check (LDPC) codes are a family of codes that are capacity approaching, simple to encode, and attractive for efficient soft decoding. Therefore, they represent attractive candidates as component codes in a reverse-concatenation architecture for tape-drive systems.

In the read channel of such a reverse-concatenation architecture, a soft detector extracts soft reliability information on channel bits and passes this information to a soft LDPC decoder. The soft detection/decoding process involves two types of recursions or iterations: iterations within the LDPC decoder (the sum-product decoding algorithm—or variants thereof—performs iterations and exchange of soft information between so-called "check nodes" and "symbol nodes") and iterations and exchange of soft information between decoder and detector. The implementation of such a soft detector/decoder poses significant challenges because it is desired to maximize system performance by increasing the number of iterations, which poses stringent requirements on circuit speed and chip area. In particular, the exchange and feedback of soft information between decoder and detector represents a significant bottleneck in the channel. Accordingly, a system and method that addresses this problem would be beneficial to tape-drive systems.

BRIEF SUMMARY

In one embodiment, a tape drive system includes a soft detector, including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during a second time interval and for executing a second reverse loop of the detection algorithm on the first block during a fifth time interval, logic, implemented in a fourth hardware engine, adapted for executing a second forward loop of the detection algorithm on the first block during a fourth time interval using second soft information, wherein the soft detector passes first soft information to a soft decoder based on the executing of the first forward and reverse loops, and wherein the soft detector passes third soft information to the soft decoder based on the executing of the second forward and reverse loops, with the soft decoder including logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm during the third time interval, and logic adapted for outputting a first decoded block of signal samples based on the executing the decoding algorithm on the first block during the sixth time interval, wherein a sum of the second, third, fourth, fifth, and sixth time intervals are about equal in duration to the first time interval.

In another embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block of signal samples during the first time interval to produce first soft information, logic, implemented in a third hardware engine, adapted for executing a second forward loop of the detection algorithm on the first block during a third time interval, and logic, implemented in a fourth hardware engine, adapted for executing a second reverse loop of the detection algorithm on the first block during the third time interval to produce third soft information, a soft decoder, including logic, implemented in a fifth hardware engine, adapted for executing a decoding algorithm on the first block during a second time interval using the first soft information to produce the second soft information and for executing the decoding algorithm on the first block during a fourth time interval using the third soft information, and logic adapted for outputting a first decoded block of signal samples based on the executing the decoding algorithm on the first block during the fourth time interval using the third soft information, wherein a sum of the second, third, and fourth time intervals are about equal in duration to the first time interval.

In yet another embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during a second time interval, logic, implemented in a fourth hardware engine, adapted for executing a second forward loop of the detection algorithm on the first block during a fourth time interval using second soft information, and logic, implemented in a fifth hardware engine, adapted for executing a second reverse loop of the detection algorithm on the first block during a fifth time interval using the second soft information, wherein the soft detector passes first soft information to a soft decoder based on the executing of the first forward and reverse loops of the detection algorithm on the first block, and wherein the soft detector passes third soft information to the soft decoder based on the executing of the second forward and reverse loops of the detection algorithm on the first block, with the soft decoder includes logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm on the first block during the third time interval, and logic adapted for outputting a first decoded block of signal samples based on the executing the decoding algorithm on the first block during the sixth time interval, wherein a sum of the second, third, fourth, fifth, and sixth time intervals are about equal in duration to twice the first time interval.

According to another embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during the first time interval, logic, implemented in a fourth hardware engine, adapted for executing a second forward loop of the detection algorithm on the first block during a third time interval using second soft information, and logic, implemented in a fifth hardware engine, adapted for executing a second reverse loop of the detection algorithm on the first block during the third time interval using the second soft information, wherein the soft detector passes first soft information to a soft decoder based on the executing of the first forward and reverse loops of the detection algorithm on the first block, and wherein the soft detector passes third soft information to the soft decoder based on the executing of the second forward and reverse loops of the detection algorithm on the first block, with the soft decoder including logic, implemented in a third hardware engine, adapted for executing a decoding algorithm on the first block during a second time interval using the first soft information and for executing the decoding algorithm on the first block during a fourth time interval using the third soft information, wherein the soft decoder produces the second soft information based on the executing of the decoding algorithm on the first block during the second time interval, and logic adapted for outputting a first decoded block of signal samples based on the executing the decoding algorithm on the first block during the fourth time interval, wherein a stun of the second, third, and fourth time intervals are about equal in duration to twice the first time interval.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrates by way of example the principles of the invention.

DETAILED DESCRIPTION

Figure 1:
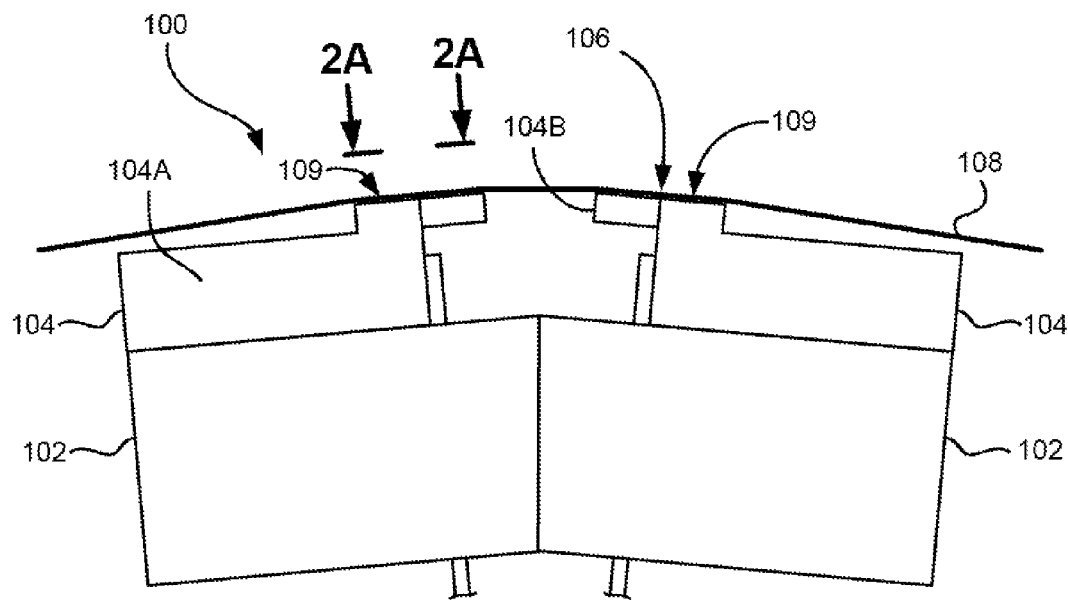
FIG. 1 illustrates a flat-lapped magnetic tape head, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, a combined soft detector/decoder is provided which simplifies the architecture and logic for a tape drive system.

In one general embodiment, a tape drive system includes a soft detector, including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during a second time interval and for executing a second reverse loop of the detection algorithm on the first block during a fifth time interval, logic, implemented in a fourth hardware engine, adapted for executing a second forward loop of the detection algorithm on the first block during a fourth time interval using second soft information, wherein the soft detector passes first soft information to a soft decoder based on the executing of the first forward and reverse loops, and wherein the soft detector passes third soft information to the soft decoder based on the executing of the second forward and reverse loops, with the soft decoder including logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm during the third time interval, and logic adapted for outputting a first decoded block of signal samples based on the executing the decoding algorithm on the first block during the sixth time interval, wherein a sum of the second, third, fourth, fifth, and sixth time intervals are about equal in duration to the first tune interval.

In another general embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block of signal samples during the first time interval to produce first soft information, logic, implemented in a third hardware engine, adapted for executing a second forward loop of the detection algorithm on the first block during a third time interval, and logic, implemented in a fourth hardware engine, adapted for executing a second reverse loop of the detection algorithm on the first block during the third time interval to produce third soft information, a soft decoder, including logic, implemented in a fifth hardware engine, adapted for executing a decoding algorithm on the first block during a second time interval using the first soft information to produce the second soft information and for executing the decoding algorithm on the first block during a fourth time interval using the third soft information, and logic adapted for outputting a first decoded block of signal samples based on the executing the decoding algorithm on the first block during the fourth time interval using the third soft information, wherein a sum of the second, third, and fourth time intervals are about equal in duration to the first time interval.

In yet another general embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during a second time interval, logic, implemented in a fourth hardware engine, adapted for executing a second forward loop of the detection algorithm on the first block during a fourth time interval using second soft information, and logic, implemented in a fifth hardware engine, adapted for executing a second reverse loop of the detection algorithm on the first block during a fifth time interval using the second soft information, wherein the soft detector passes first soft information to a soft decoder based on the executing of the first forward and reverse loops of the detection algorithm on the first block, and wherein the soft detector passes third soft information to the soft decoder based on the executing of the second forward and reverse loops of the detection algorithm on the first block, with the soft decoder includes logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm on the first block during the third time interval, and logic adapted for outputting a first decoded block of signal samples based on the executing the decoding algorithm on the first block during the sixth time interval, wherein a sum of the second, third, fourth, fifth, and sixth time intervals are about equal in duration to twice the first time interval.

According to another general embodiment, a tape drive system includes a soft detector including logic, implemented in a first hardware engine, adapted for executing a first forward loop of a detection algorithm on a first block of signal samples during a first time interval, logic, implemented in a second hardware engine, adapted for executing a first reverse loop of the detection algorithm on the first block during the first time interval, logic, implemented in a fourth hardware engine, adapted for executing a second forward loop of the detection algorithm on the first block during a third time interval using second soft information, and logic, implemented in a fifth hardware engine, adapted for executing a second reverse loop of the detection algorithm on the first block during the third time interval using the second soft information, wherein the soft detector passes first soft information to a soft decoder based on the executing of the first forward and reverse loops of the detection algorithm on the first block, and wherein the soft detector passes third soft information to the soft decoder based on the executing of the second forward and reverse loops of the detection algorithm on the first block, with the soft decoder including logic, implemented in a third hardware engine, adapted for executing a decoding algorithm on the first block dining a second time interval using the first soft information and for executing the decoding algorithm on the first block during a fourth time interval using the third soft information, wherein the soft decoder produces the second soft information based on the executing of the decoding algorithm on the first block during the second time interval, and logic adapted for outputting a first decoded block of signal samples based on the executing the decoding algorithm on the first block during the fourth time interval, wherein a sum of the second, third, and fourth time intervals are about equal in duration to twice the first time interval.

In another general embodiment, a method includes executing a first forward loop of a detection algorithm on a first block of signal samples during a first time interval, executing a first reverse loop of the detection algorithm on the first block during a second time interval to produce first soft information, executing a decoding algorithm on the first block during a third time interval using the first soft information to produce second soft information, executing a second forward loop of the detection algorithm on the first block during a fourth time interval using the second soft information, executing a second reverse loop of the detection algorithm on the first block during a fifth time interval to produce third soft information, executing the decoding algorithm on the first block during a sixth time interval using the third soft information to produce a decoded block of signal samples, and outputting the first decoded block of signal samples.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a flat-lapped bi-directional, two-module magnetic tape head 100, in accordance with one embodiment.

As shown, the head includes a pair of bases 102, each equipped with a module 104. The bases may be "U-beams" that are adhesively coupled together. Each module 104 includes a substrate 104A and a closure 104B with readers and writers 106 situated therebetween. In use, a tape 108 is moving over the modules 104 along a tape bearing surface 109 in the manner shown for reading and writing data on the tape 108 using the readers and writers 106. Conventionally, a partial vacuum is formed between the tape 108 and the tape bearing surface 109 for maintaining the tape 108 in close proximity with the readers and writers 106.

The substrates 104A are typically constructed of a wear resistant material, such as a ceramic. The closures 104B may be made of the same or similar ceramic as the substrates 104A.

The readers and writers 106 may be arranged in a piggyback configuration. The readers and writers 106 may also be arranged in an interleaved configuration. Alternatively, each array of channels may be readers or writers only. Any of these arrays may contain one or more servo readers.

Figure 2B:
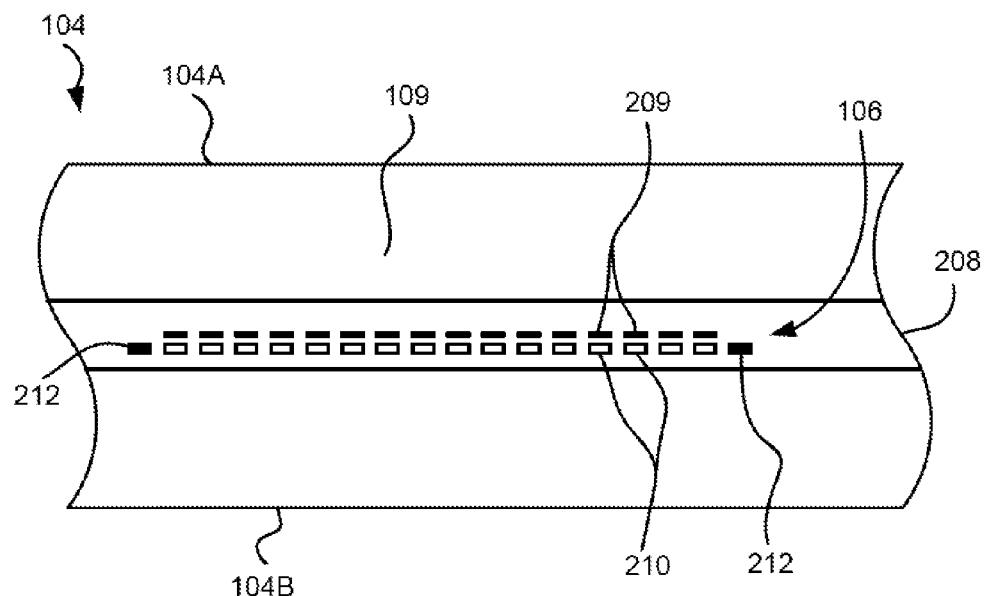
FIG. 2B is a detailed view taken from Circle 2B of FIG. 2A.
Figure 2A:
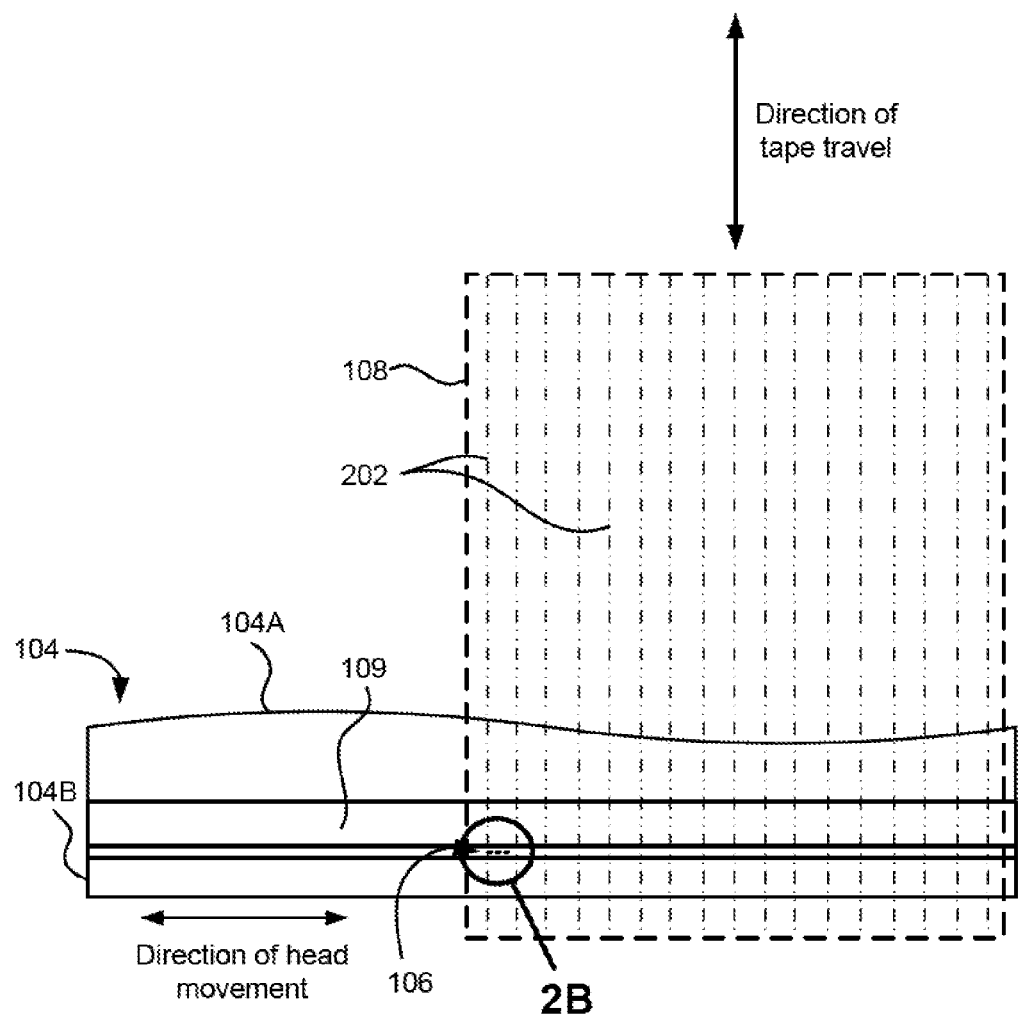
FIG. 2A is a tape bearing surface view taken from Line 2A of FIG. 1.

FIG. 2A illustrates the tape bearing surface 109 of one of the modules 104. A representative tape 108 is shown in dashed lines. The module 104 is preferably long enough to be able to support the tape as the head steps between data bands.

In this example, the tape 108 includes 4-22 data bands, e.g., with 16 data bands and 17 servo tracks 202, as shown in FIG. 2A on a one-half inch wide tape 108. The data bands are defined between servo tracks 202. Each data band may include a number of data tracks, for example 96 data tracks (not shown). During read/write operations, the elements 106 are positioned within one of the data bands. Outer readers, sometimes called servo readers, read the servo tracks 202. The servo signals are in turn used to keep the elements 106 aligned with a particular track during the read/write operations.

FIG. 2B depicts a plurality of read and/or write elements 106 formed in a gap 208 on the module 104 of FIG. 2A. As shown, the array of elements 106 includes, for example, 16 writers 209, 16 readers 210 and two servo readers 212, though the number of elements may vary. Illustrative embodiments include 8, 16, 32, and 64 elements per array 106. A preferred embodiment includes 16 readers per array and/or 16 writers per array. While the readers and writers may be arranged in a piggyback configuration as shown in FIG. 2B, the readers 210 and writers 209 may also be arranged in an interleaved configuration. Alternatively, each array of elements 106 may be readers or writers only, and the arrays may contain one or more servo readers. As noted by considering FIGS. 1 and 2A-B together, each module 104 may include a complementary set of elements 106 for such functions as bi-directional reading and writing, read-while-write capability, etc.

In some embodiments, the width of the servo reader is such that transition broadening effects are minimized. Giant Magnetoresistive (GMR) and Tunneling Magnetoresistive (TMR) devices are preferably used in servo readers for advanced formats which require servo readers having small widths such as 0.5 micrometers.

Figure 3:
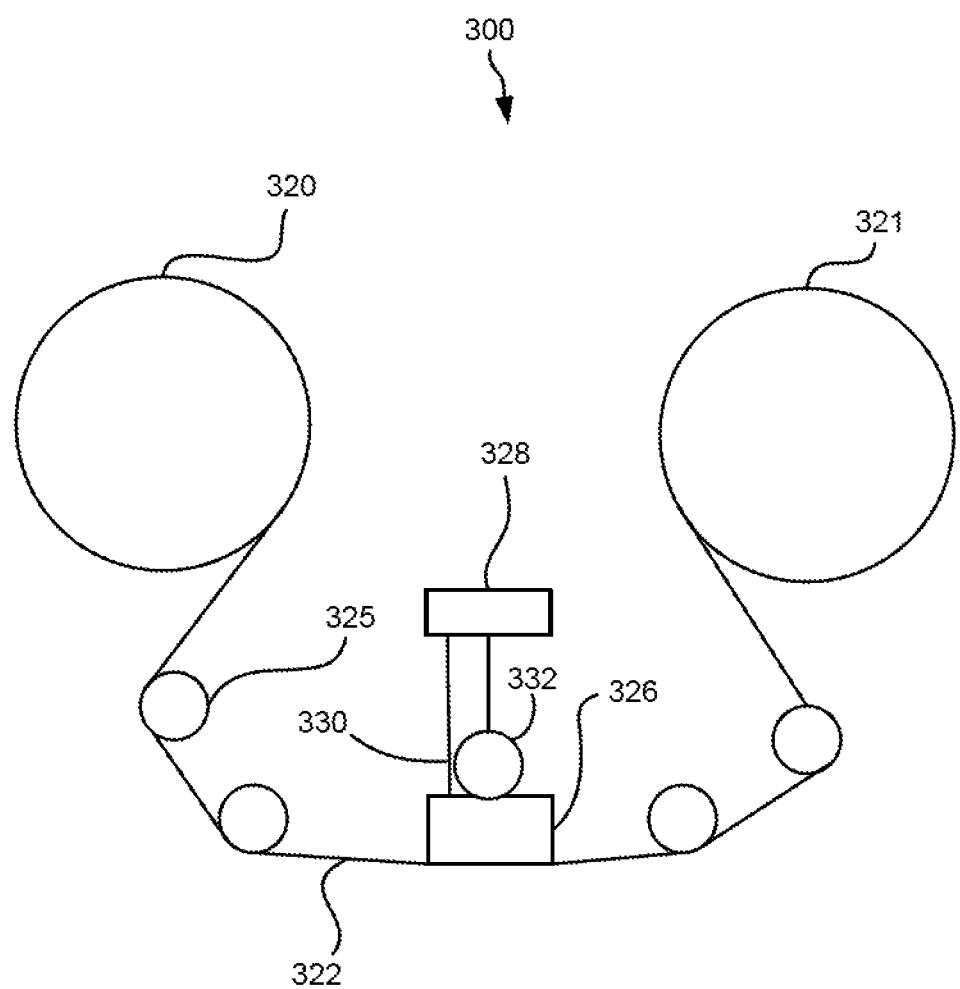
FIG. 3 illustrates a simplified tape drive of a tape-based data storage system, according to one embodiment.

FIG. 3 illustrates a simplified tape drive 300 of a tape-based data storage system, which may be employed according to various embodiments. While one specific implementation of a tape drive is shown in FIG. 3, it should be noted that the embodiments described herein may be implemented in the context of any type of tape drive system.

As shown, a tape supply cartridge 320 and a take-up reel 321 are provided to support a tape 322. One or more of the reels may form part of a removable cassette and are not necessarily part of the system 300. The tape drive, such as that illustrated in FIG. 3, may further include drive motor(s) to drive the tape supply cartridge 320 and the take-up reel 321 to move the tape 322 over a tape head 326 of any type.

Guides 325 guide the tape 322 across the tape head 326. Such tape head 326 is in turn coupled to a controller assembly 328 via a cable 330. The controller 328 typically comprises a servo channel and controls head functions, such as track following, writing, reading, etc. The cable 330 may include read/write circuits to transmit data to the head 326 to be recorded on the tape 322 and to receive data read by the head 326 from the tape 322. An actuator 332 determines position of the head 326 relative to the tape 322.

An interface may also be provided for communication between the tape drive and a host (integral or external) to send and receive the data and for controlling the operation of the tape drive and communicating the status of the tape drive to the host, all as will be understood by those of skill in the art.

For the remainder of this document, a coded tape storage device is described. However, the embodiments and approaches described herein may be applied to a variety of other communication channels which are not explicitly described, but would be known to one of skill in the art. More precisely, it is assumed that data written on magnetic tape represents low-density parity-check (LDPC) codewords (herein, LDPC coding is discussed but other soft-decodable codes may be used for error correction coding (ECC), as would be known to one of skill in the art).

Figure 4:
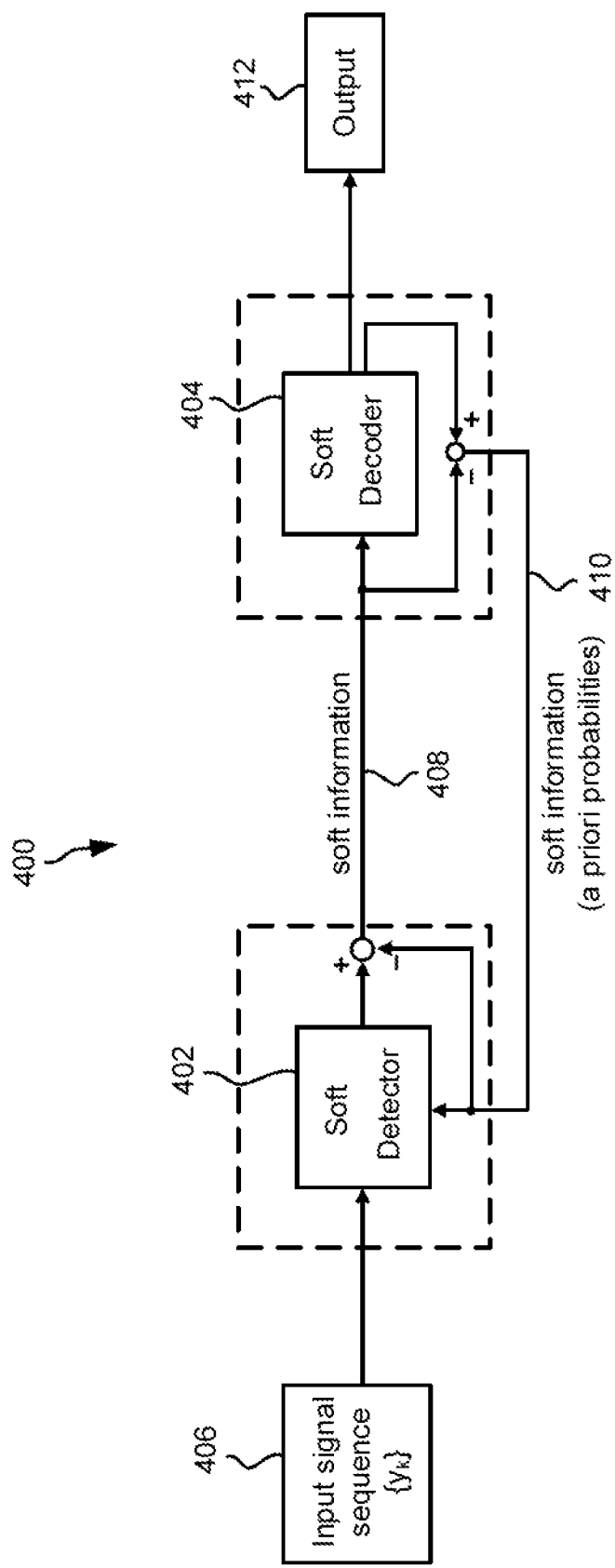
FIG. 4 shows a general block diagram for performing joint soft-detection and soft-decoding.

Referring now to FIG. 4, a general block diagram is shown for performing joint soft-detection and soft-decoding, which may be used in the context and functionality of some of the embodiments described herein. Both the soft detector 402 and the soft decoder 404 operate on blocks of signals whose length is equal to a codeword length N. In other words, processing at the soft detector 402 as well as at the soft decoder 404 is performed blockwise. The codeword length N may be set at any desired value, and in some embodiments, may be about 2000 bits, 4000 bits, 5000 bits, or more or less, in various approaches. In preferred approaches, the codeword length N may be less than about 10,000 bits.

The soft detector 402 takes at its input the readback signal samples denoted by $y_k$ 406 (i.e., after equalization, gain adjustment and timing control) and delivers at its output soft information 408 (which may be considered reliability information) on the (coded) individual bits written on the tape medium. In one approach, any of a number of algorithms known in the art may be implemented in the soft detector 402, for example the Bahl-Cocke-Jelinek-Raviv (BCJR), the dual MAX (DMAX), and/or the sliding window DMAX (SW-DMAX) algorithms. In fact, any soft-detection algorithm that involves a forward pass and a backward pass (more on this below) is relevant and may be used in the embodiments and approaches described herein. The embodiments described herein assume DMAX and SW-DMAX detection, but any detection may be used.

In addition, the soft detector 402 may use soft information 410 produced by the soft decoder 404. This soft information 410 may include a priori probabilities that a bit is either a 0 or a 1. For the first pass, the a priori probability that a bit is a 0 or a 1 is ½, e.g., it is an equal chance that a bit is either symbol. After at least one iteration through the soft decoder 404 has been performed, a priori probabilities may be calculated, using algorithms known in the art.

The soft decoder 404 takes in the soft information 408 computed by the soft detector 402 and performs decoding, such as LDPC decoding. This operation is performed by applying the sum-product algorithm (SPA), or by using simplified versions of the SPA. These algorithms represent iterative decoding techniques, that is, by increasing the number of iterations, it is possible to reduce the error rate at the soft decoder 404 output. The implementation complexity of the SPA or its variants may be significant, in some approaches. The fact that LDPC decoding is performed iteratively is not directly an issue of concern herein, but what is important is the fact that iterations also take place between the soft decoder 404 and soft detector 402. This is explained in more detail next.

As shown in FIG. 4, after the soft decoder 404 has completed its operations, it holds soft information 410 on the individual codeword symbols, which may be described as a priori probabilities of the codeword symbols being a 0 or a 1. This soft information 410 is generally different from the soft information 408 that was conveyed by the soft detector 402 to the soft decoder 404. Therefore, the soft decoder 404 feeds back its own soft information 410 to the soft detector 402, so that the soft detector 402 may re-detect the same block of data at least once more. In the second detection, the soft information 410 provided by the soft decoder 404 may be used in the detection. Then, the soft detector 402 passes the new set of soft information 408 to the soft decoder 404, which again attempts to decode the same codeword information. This iterative decoding/detection procedure may be repeated once, twice, several times, or more, depending on a performance level desired and acceptable latency for the detecting/decoding operation.

As indicated above, the detection operations involve a forward computation step and a backward computation step. These steps can be thought of as corresponding to limning a Viterbi-algorithm-like computation on a channel trellis forward and backward in tune. The basic idea is illustrated in FIG. 5, according to one embodiment.

Figure 5:
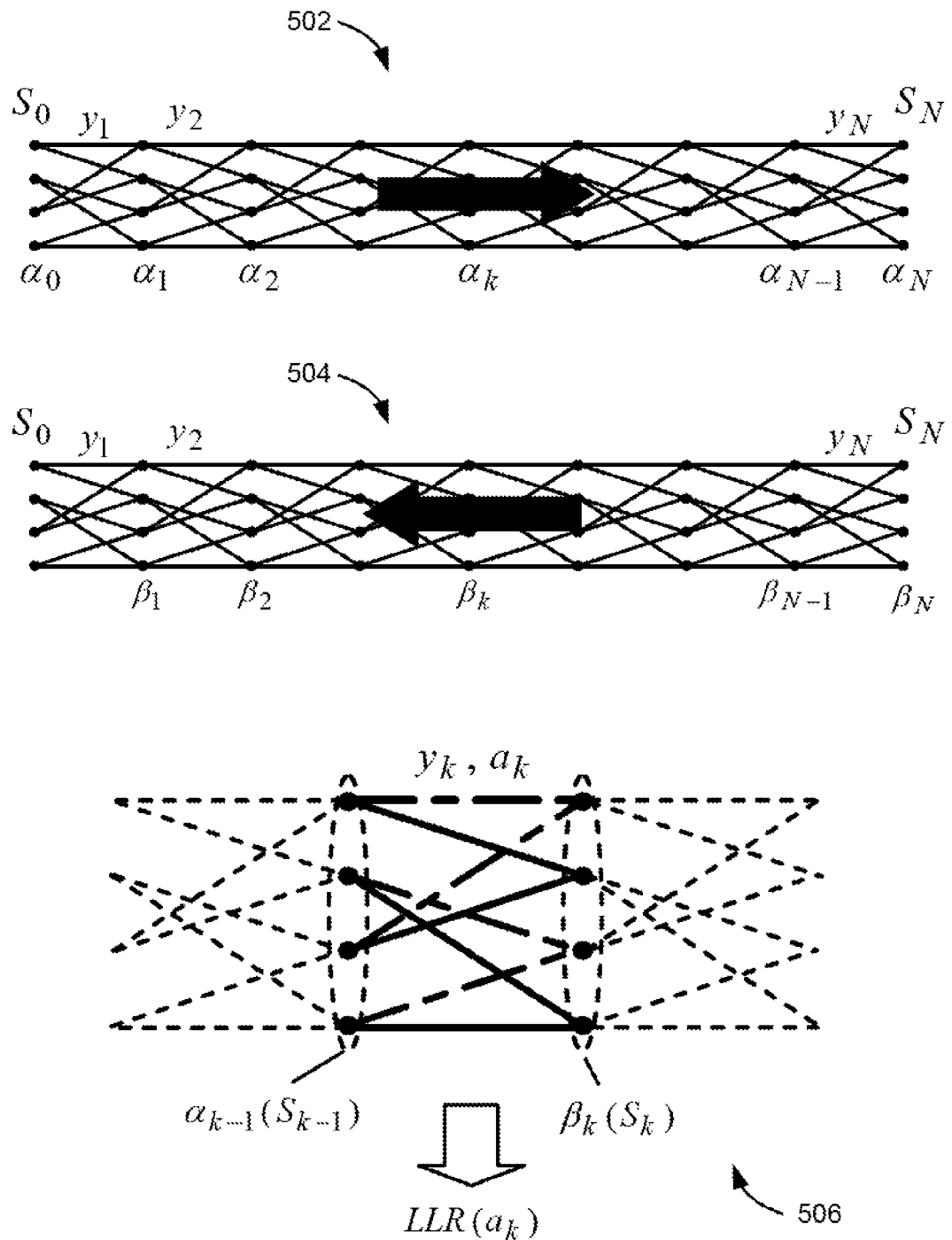
FIG. 5 shows forward computation steps and a backward computation steps of a detection algorithm, according to one embodiment.

In FIG. 5, it is assumed that a codeword having a block of N signal samples $y_1, \ldots, y_N$ is received at the soft detector. Upper diagram 502 shows a part of the algorithm that is applied forward in time assuming, for illustrative purposes, a simple 4-state trellis; state values at initial time 0 are denoted by $S_0$ and state values at final time N are denoted by $S_N$. The forward algorithm computes a set of values denoted by $\alpha_0, \alpha_1, \ldots, \alpha_N$. Middle diagram 504 shows the backward pass, where the quantities $\beta_N, \ldots, \beta_2, \beta_1$ are computed on the same trellis. Lower diagram 506 shows that by combining the values obtained in the forward and backward passes ($\alpha_0, \alpha_1, \ldots, \alpha_N$ and $\beta_1, \beta_2, \ldots, \beta_N$), it is possible to compute soft information (which is shown as a log-likelihood ratio LLR) on the individual bits $\alpha_k$ that form the codeword being processed. These LLR values may then be passed to the soft decoder, in one embodiment. Of course, in other approaches, other soft information may be calculated, such as other likelihood calculations, as would be known to one of skill in the art.

It is readily apparent that the efficient implementation of the soft detecting/soft decoding scheme described in regard to FIGS. 4-5 poses significant challenges at high data rates and/or for codes having medium to long codeword lengths. One important bottleneck is due to the feedback of soft information from the soft decoder to the soft detector. This causes severe requirements, including requiring extremely high circuit speed. Another issue is storing and buffering signals that are used for the successive iteration steps in each of the soft detector and the soft decoder. All together, an efficient architectural solution that also anticipates and allows for proper scheduling of the various detection/decoding steps would be very beneficial.

For the methods described below according to various embodiments, it is assumed that the soft detector is used twice: once in a first (initial) pass after receiving input signal samples where detection does not include using feedback from the soft decoder; and another tune in a second pass where soft information provided by the soft decoder is used to detect the block of data. Therefore, in one embodiment, soft detection may involve four hardware engines (or software engines, but hardware engines are preferred). These four hardware engines include, but are not limited to FL0: forward loop 0, RL0: reverse loop 0, FL1: forward loop 1, and RL1: reverse loop 1, as shown in FIGS. 6A, 6B, 7, 9, and 10.

Clearly, FL0 and RL0 may be used to perforin the first pass detection and FL1 and RL1 are used to perform the second pass detection. In addition, it is assumed that only one soft decoding engine is employed (which is a LPDC decoding engine, in one approach, as the area requirements for a sum-product decoder may be quite substantial, and therefore should be avoided).

Figure 6A:
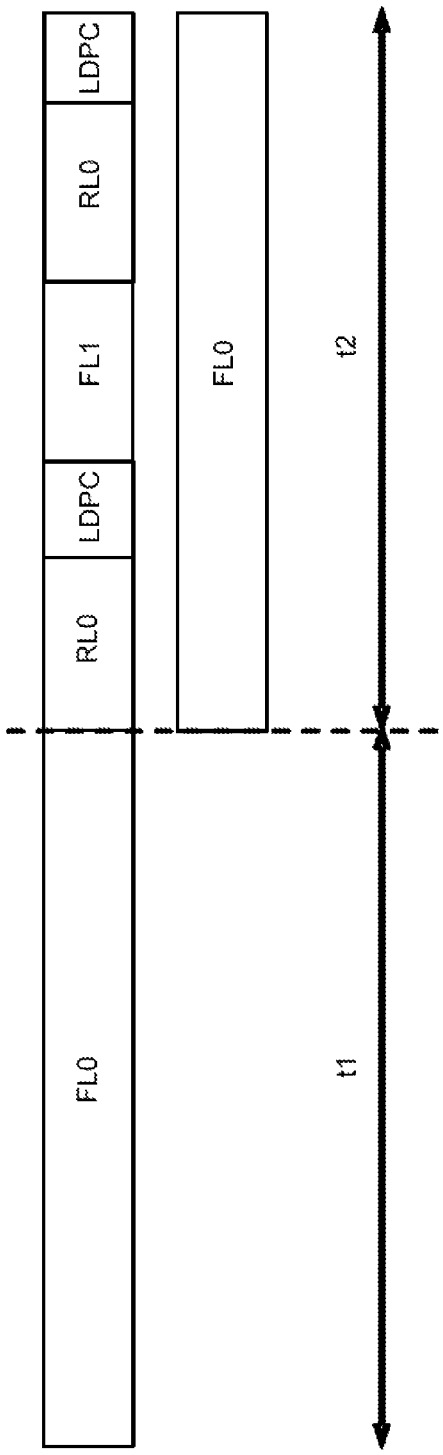
FIG. 6A shows a soft detecting/soft decoding system according to one embodiment.
Figure 6B:
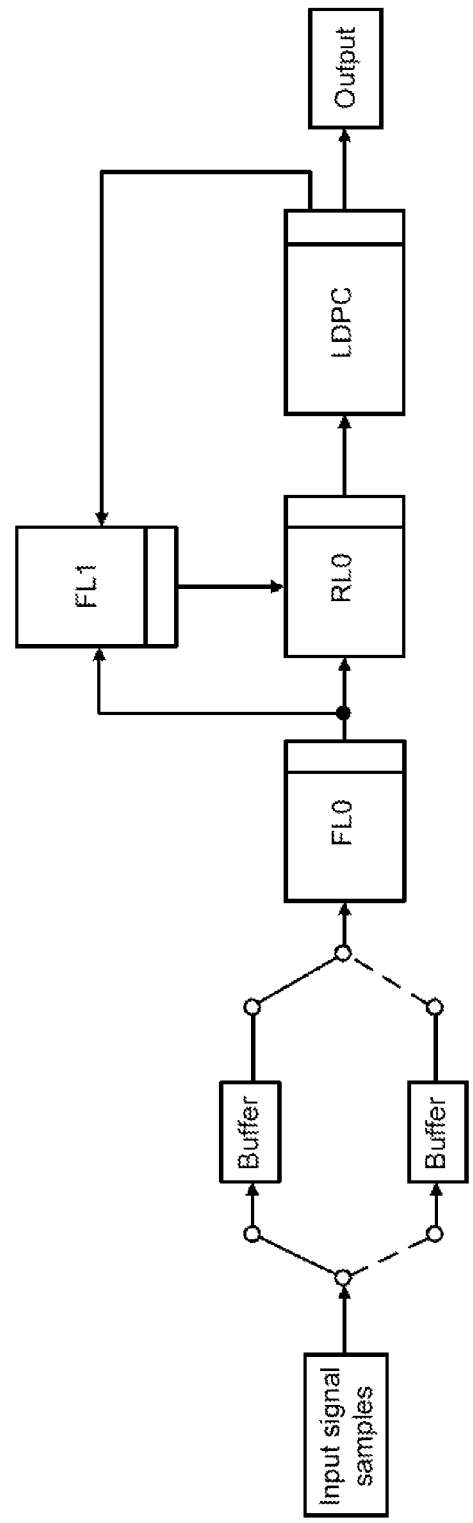
FIG. 6B shows a block diagram of a soft detecting/soft decoding system according to one embodiment.
Figure 7:
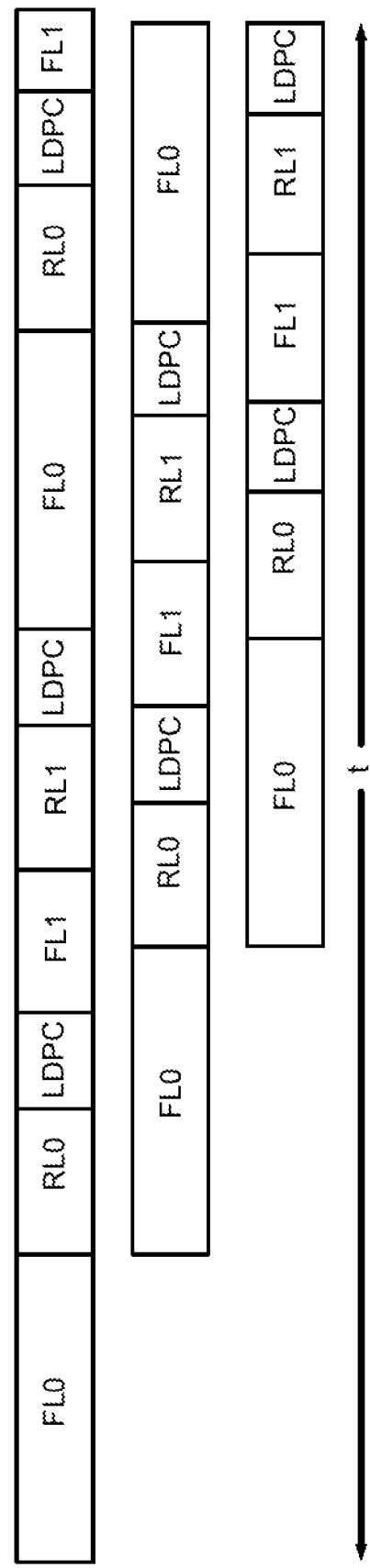
FIG. 7 shows a soft detecting/soft decoding system according to one embodiment.

In the embodiments described in FIGS. 6A, 6B, and 7, the soft decoder uses a DMAX detection algorithm. In the embodiments described in FIGS. 8 and 9, the soft decoder uses a SW-DMAX detection algorithm. Of course, other detection algorithms may be used, as known in the art, but adjustments and/or modifications may be needed to adapt the embodiments to the timing of the detection algorithm used, which may be determined by one of skill in the art upon reading the present descriptions.

Now referring to FIG. 6A, one embodiment of a soft detecting/soft decoding system is shown. During time interval t1 that corresponds to use of hardware engine FL0, the forward detection algorithm is executed on a block of channel signal samples, referred to herein as $y_1^{(1)}, \ldots, y_N^{(1)}$. At the end of time interval t1, the same hardware engine FL0 may be used to process the next block of N signal samples $y_1^{(2)}, \ldots, y_N^{(2)}$ during time interval t2 (the duration of t2 is equal to that of t1). Also, during t2, the following operations are performed in sequence: (a) the backward pass of the detection algorithm is run on data block $y_1^{(1)}, \ldots, y_N^{(1)}$, as indicated by the time interval corresponding to RL0 (the duration of this time interval is ¼ of t2); (b) first decoding is performed by the soft decoder LDPC (time interval is ⅛ of t2); (c) second forward pass is performed of the detection algorithm on data block $y_1^{(1)}, \ldots, y_N^{(1)}$, as indicated by the time interval corresponding to FL1 (time interval is ¼ of t2); (d) the backward pass of the detection algorithm is run again on data block $y_1^{(1)}, \ldots, y_N^{(1)}$, as indicated by the time interval corresponding to RL0 (time interval is ¼ of t2); and (e) second decoding by soft decoder LDPC is performed (time interval is ⅛ of t2).

In this embodiment, as shown in FIG. 6B, the system comprises two forward engines (FL0 and FL1), one reverse engine (RL0), two buffers adapted to store $y_1^{(1)}, \ldots, y_N^{(1)}$ and $y_1^{(2)}, \ldots, y_N^{(2)}$, two buffers adapted to store branch metric calculations, and one LDPC hardware engine. This system does not need or include a hardware engine RL1, since the RL0 engine may be used for reverse loops 0 and 1 at different times during time interval t2.

The time interval for FL1 is shorter than that for FL0 because some quantities that are computed during FL0 may be re-used during FL1, which is explained in more detail later. Similarly, the time interval to execute RL0 is less than the time interval for FL0 because some quantities that are computed during FL0 may be re-used during RL0.

For example, referring to FIGS. 4 and 6A, in one embodiment, a tape drive system 400 may comprise a soft detector 402 and a soft decoder 404. The soft detector 402 may comprise logic, implemented in a first hardware engine FL0, adapted for executing a first forward loop of a detection algorithm on a first block of signal samples 406 ($y_1^{(1)}, \ldots, y_N^{(1)}$) during a first time interval t1, logic implemented in a second hardware engine RL0 adapted for executing a first reverse loop of the detection algorithm on the first block during a second time interval (first ¼ of t2 labeled RL0) and for executing a second reverse loop of the detection algorithm on the first block during a fifth time interval (third ¼ of t2 labeled RL0), and logic implemented in a fourth hardware engine FL1 adapted for executing a second forward loop of the detection algorithm on the first block during a fourth time interval (first ⅛ of t2 labeled FL1) using second soft information. The soft detector 402 passes first soft information 408 to the soft decoder 404 based on the executing of the first forward and reverse loops, and the soft detector 402 passes third soft information 408 to the soft decoder 404 based on the executing of the second forward and reverse loops.

The soft decoder 404 comprises logic, implemented in a third hardware engine LDPC, adapted for executing a decoding algorithm on the first block during a third time interval (first ⅛ of t2 labeled LDPC) using the fast soft information 408 and for executing the decoding algorithm on the first block during a sixth time interval (second ⅛ of t2 labeled LDPC) using the third soft information 408. The soft decoder 404 produces the second soft information 410 based on the executing of the decoding algorithm during the third time interval.

The system 400 also comprises logic adapted for outputting a first decoded block of signal samples 412 based on the executing the decoding algorithm on the first block during the sixth time interval. In addition, a sum of the second, third, fourth, fifth, and sixth time intervals (equals t2) are about equal in duration to the first time interval t1.

According to another embodiment, the first hardware engine FL0 may execute the first forward loop of the detection algorithm on a second block of signal samples contemporaneous (at the same time as the transpiring of) with the second, third, fourth, fifth, and sixth time intervals (cumulatively t2), e.g., the first hardware engine FL0 may process a second block of signal samples during t2, as shown in FIG. 6A.

In a further example, the second time interval (for RL0) is about ¼ of the first time interval t1 (for FL0) and occurs immediately subsequent to the first time interval t1, the third time interval (for LDPC) is about ¼ of the first time interval t1 and occurs immediately subsequent to the second time interval, the fourth time interval (for FL1) is about ¼ of the first time interval t1 and occurs immediately subsequent to the third time interval, the fifth time interval (for RL0) is about ¼ of the first time interval t1 and occurs immediately subsequent to the fourth time interval, and the sixth time interval (for LDPC) is about ⅛ of the first time interval t1 and occurs immediately subsequent to the fifth time interval.

In another embodiment, the tape drive system may also comprise a magnetic head, a drive mechanism adapted for passing a magnetic medium over the magnetic head, a controller electrically coupled to the magnetic head, the controller being adapted for controlling operation of the magnetic head, logic adapted for receiving the signal samples via the magnetic head, and buffer storage memory adapted for storing: the first block of signal samples ($y_1^{(1)}, \ldots, y_N^{(1)}$), the second block of signal samples ($y_1^{(2)}, \ldots, y_N^{(2)}$), branch metric calculations for the detection algorithm associated with the first block of signal samples, and branch metric calculations for the detection algorithm associated with the second block of signal samples. The branch metric calculations may be used to compute the values obtained in the forward and backward passes ($\alpha_0, \alpha_1, \ldots, \alpha_N$ and $\beta_1, \beta_1, \ldots, \alpha_N$), as shown in more detail in FIG. 5.

Now referring to FIG. 7, one embodiment of a soft detecting/soft decoding system is shown. In this embodiment, the system would use two forward engines (FL0 and FL1), two reverse engines (RL0 and RL1), three buffers adapted to store $y_1^{(1)}, \ldots, y_N^{(1)}, y_1^{(2)}, \ldots, y_N^{(2)}$, and $y_1^{(3)}, \ldots, y_N^{(3)}$, three buffers adapted to store branch metric calculations, and one LDPC hardware engine. As can be seen, the timing requirements in this embodiment are relaxed for each engine, as compared to the system shown in FIGS. 6A-6B, but an additional engine (RL1) as well as additional buffers are employed. This method utilizes about 50% more processing time as does the method described in FIGS. 6A-6B.

According to one example, as shown in FIGS. 4 and 7, a tape drive system 400 may comprise a soft detector 402 and a soft decoder 404. The soft detector 402 comprises logic, implemented in a first hardware engine FL0, adapted for executing a first forward loop of a detection algorithm on a first block of signal samples ($y_1^{(1)}, \ldots, y_N^{(1)}$) during a first time interval (shown as the FL0 at the top left of the upper sequence), logic implemented in a second hardware engine RL0 adapted for executing a first reverse loop of the detection algorithm on the first block during a second time interval (shown as the RL0 adjacent the first FL0 of the upper sequence), logic implemented in a fourth hardware engine FL1 adapted for executing a second forward loop of the detection algorithm on the first block during a fourth time interval (shown as the FL1 to the right of the first LDPC of the upper sequence) using second soft information, and logic implemented in a fifth hardware engine RL1 adapted for executing a second reverse loop of the detection algorithm on the first block during a fifth time interval (shown as the RL1 adjacent the first FL1 of the upper sequence) using the second soft information. The soft detector 402 passes first soft information 408 to the soft decoder 404 based on the executing of the first forward and reverse loops of the detection algorithm on the first block, and the soft detector 402 passes third soft information 408 to the soft decoder 404 based on the executing of the second forward and reverse loops of the detection algorithm on the first block.

The soft decoder 404 comprises logic, implemented in a third hardware engine LDPC, adapted for executing a decoding algorithm on the first block during a third time interval (shown as the first LDPC in the upper sequence) using the first soft information and for executing the decoding algorithm on the first block during a sixth time interval (shown as the second LDPC in the upper sequence) using the third soft information. The soft decoder 404 produces the second soft information 410 based on the executing of the decoding algorithm on the first block during the third time interval.

Also, the system 400 comprises logic adapted for outputting a first decoded block of signal samples 412 based on the executing the decoding algorithm on the first block during the sixth time interval. A sum of the second, third, fourth, fifth, and sixth time intervals are about equal in duration to twice the first time interval, e.g., the entire process takes about the same amount of time as three times the first time interval (shown as FL0 in FIG. 7).

Furthermore, in one approach, the second time interval may be about ½ of the first time interval and may occur immediately subsequent to the first time interval, the third time interval may be about ¼ of the first time interval and may occur immediately subsequent to the second time interval, the fourth time interval may be about ½ of the first time interval and may occur immediately subsequent to the third time interval, the fifth time interval may be about ½ of the first time interval and may occur immediately subsequent to the fourth time interval, and the sixth time interval may be about ¼ of the first time interval and may occur immediately subsequent to the fifth time interval.

In another approach, the first hardware engine FL0 may begin executing the first forward loop of the detection algorithm on a second block of signal samples ($y_1^{(2)}, \ldots, y_N^{(2)}$) immediately subsequent to the executing the first forward loop of the detection algorithm on the first block ($y_1^{(1)}, \ldots, y_N^{(1)}$), and the first hardware engine may begin executing the first forward loop of the detection algorithm on a third block ($y_1^{(3)}, \ldots, y_N^{(3)}$) of signal samples immediately subsequent to the executing the first forward loop of the detection algorithm on the second block.

In another embodiment, the tape drive system may also include a magnetic head, a drive mechanism adapted for passing a magnetic medium over the magnetic head, a controller electrically coupled to the magnetic head, the controller being adapted for controlling operation of the magnetic head, logic adapted for receiving the signal samples via the magnetic head, and buffer storage memory adapted for storing the first block of signal samples, the second block of signal samples, the third block of signal samples, branch metric calculations for the detection algorithm associated with the first block of signal samples, branch metric calculations for the detection algorithm associated with the second block of signal samples, and branch metric calculations for the detection algorithm associated with the third block of signal samples.

Figure 8:
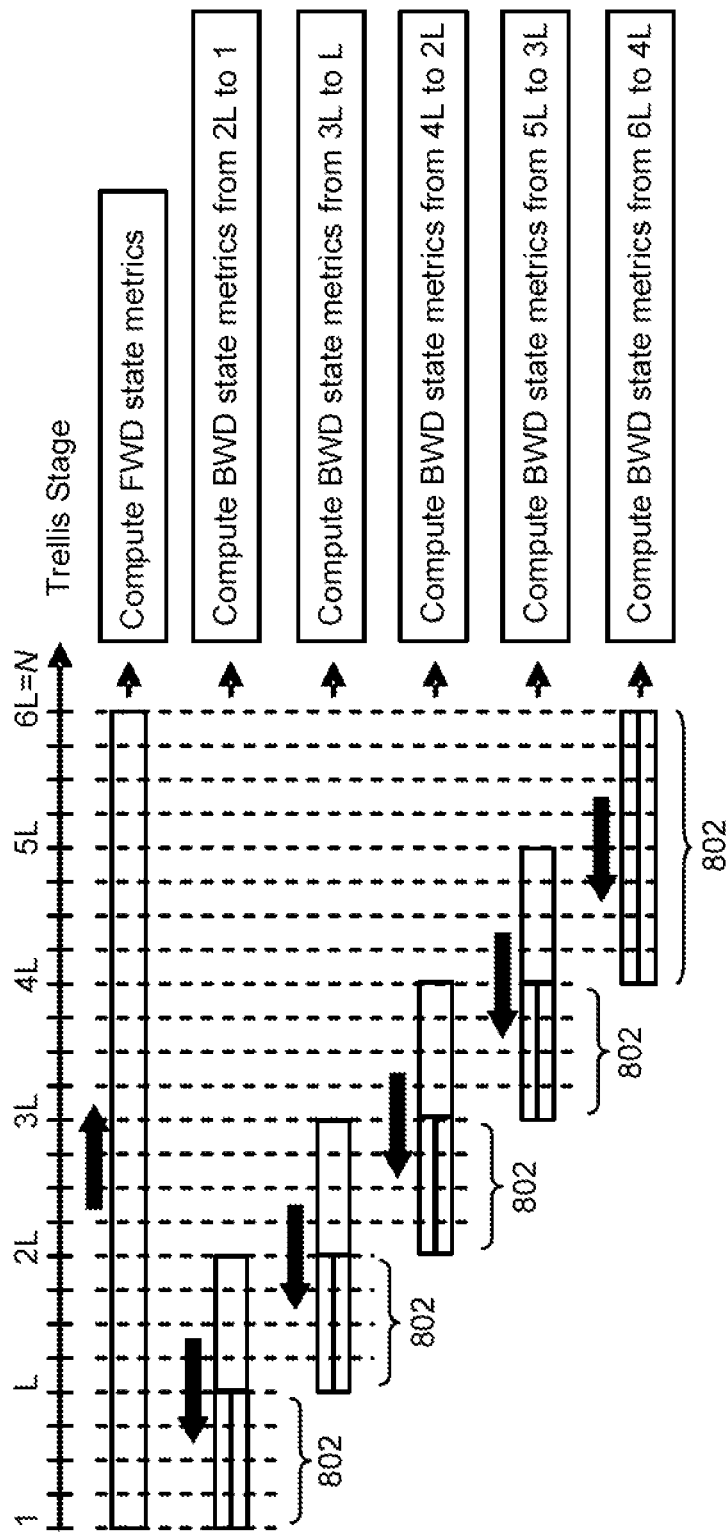
FIG. 8 is a simplified timing chart for a sliding window dual MAX (SW-DMAX) algorithm, according to one embodiment.
Figure 9:
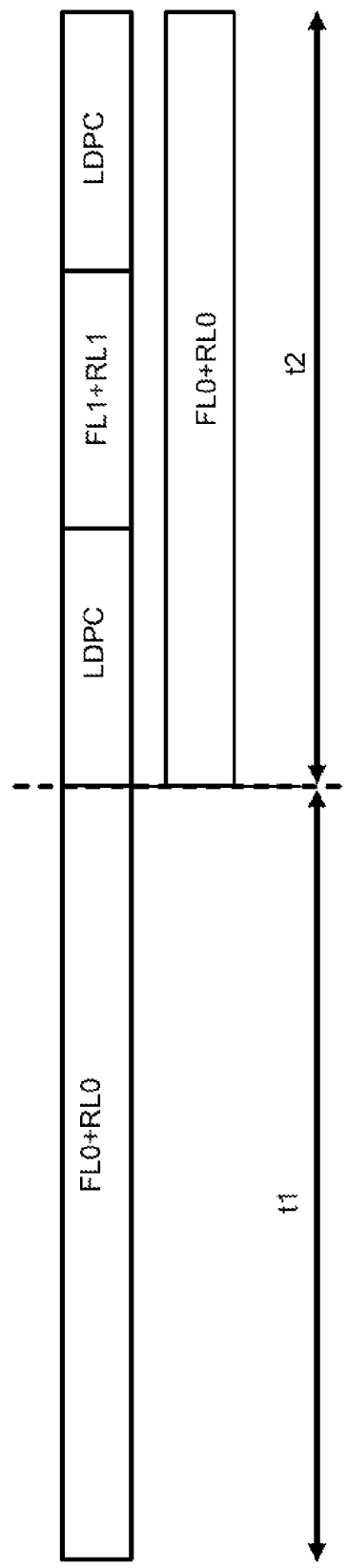
FIG. 9 shows a soft detecting/soft decoding system according to one embodiment.
Figure 10:
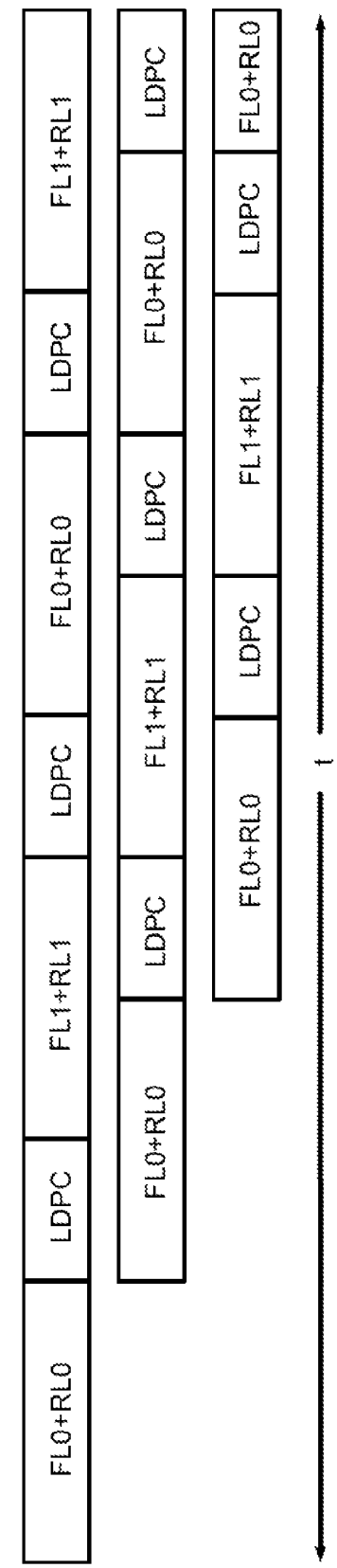
FIG. 10 shows a soft detecting/soft decoding system according to one embodiment.

The embodiments described in FIGS. 9-10 rely on a SW-DMAX algorithm. The SW-DMAX algorithm is briefly described in FIG. 8, according to one embodiment.

As shown in FIG. 8, the blocksize N is divided into six portions (N=6L). The backward algorithm (BWD) is executed on each shorter block of length 2L, as soon as the results of the forward algorithm (FWD) become available. The reverse loop results are discarded for the first half of each backward algorithm (e.g., from 2L to L, from 3L to 2L, etc.) and then the information calculated in the backward algorithm on the second half may be used for the computation of soft information 802 (e.g., from L to 1, from 2L to L, etc.). For the final calculation from 6L to 4L, soft information 802 is generated over this entire block of length 2L.

The advantages of the SW-DMAX over the DMAX algorithm include storage requirements that are independent of N (they are dependent on L only) and that there is no latency introduced due to the execution time of the backward pass (BWD). The disadvantage of the SW-DMAX algorithm is that the number of mathematical operations for the backward pass (BWD) is essentially doubled.

Now referring to FIG. 9, one embodiment Of a soft detecting/soft decoding system is shown. In this embodiment relying on SW-DMAX, both the forward pass FL0 and backward pass RL0 of the detection algorithm may be executed during time interval t1 (hence the notation FL0+RL0, and also FL1+RL1). In this embodiment, the system may use, according to one embodiment, two forward engines (FL0 and FL1), two reverse engines (RL0 and RL1), one LDPC hardware engine, two buffers to store $y_1^{(1)}, \ldots, y_N^{(1)}$ and $y_1^{(2)}, \ldots, y_N^{(2)}$, and two buffers adapted to store branch metric calculations. Also note that compared to embodiment shown in FIGS. 6A, 6B, and 7, the timing constraints are relaxed as both LDPC and FL1+RL1 use a time interval of only ⅓ of t2.

In this approach, the detection algorithm may be a SW-DMAX algorithm and the decoding algorithm may be a LDPC decoding algorithm.

According to one example, as shown in FIGS. 4 and 9, a tape drive system 400 comprises a soft detector 402 and a soft decoder 404. The soft detector 402 comprises logic, implemented in a first hardware engine FL0, adapted for executing a first forward loop of a detection algorithm on a first block of signal samples during a first time interval t1, logic implemented in a second hardware engine RL0 adapted for executing a first reverse loop of the detection algorithm on the first block of signal samples during the first time interval t1 to produce first soft information 408, logic implemented in a third hardware engine FL1 adapted for executing a second forward loop of the detection algorithm on the first block during a third time interval (part of time interval t2), and logic implemented in a fourth hardware engine RL1 adapted for executing a second reverse loop of the detection algorithm on the first block during the third time interval (the same part of time interval t2) to produce third soft information 410.

The soft decoder 404 comprises logic, implemented in a fifth hardware engine LDPC, adapted for executing a decoding algorithm on the first block during a second time interval (part of time interval t2) using the first soft information 408 to produce the second soft information 410 and for executing the decoding algorithm on the first block during a fourth time interval (part of time interval t2) using the third soft information 408. The system 400 also includes logic adapted for outputting a first decoded block of signal samples 412 based on the executing the decoding algorithm on the first block during the fourth time interval using the third soft information. A sum of the second, third, and fourth time intervals are about equal in duration to the first time interval t1, e.g., the second, third, and fourth time intervals constitute t2.

In one approach, as shown in FIG. 9, the second time interval (shown as the leftmost LDPC) may be about ⅓ of the first tune interval t1 and occurs immediately subsequent to the first time interval t1, the third time interval (shown as FL1+RL1) may be about ⅓ of the first time interval t1 and occurs immediately subsequent to the second time interval, and the fourth time interval (shown as the rightmost LDPC) may be about ⅓ of the first time interval t1 and occurs immediately subsequent to the third time interval.

In another approach, the first hardware engine FL0 may execute the first forward loop and the second hardware engine RL0 may execute the first reverse loop of the detection algorithm on a second block of signal samples ($y_1^{(2)}, \ldots, y_N^{(2)}$) contemporaneous with the second, third, and fourth time intervals (e.g., during t2).

In a further embodiment, the system may include a magnetic head, a drive mechanism adapted for passing a magnetic medium over the magnetic head, a controller electrically coupled to the magnetic head, the controller being adapted for controlling operation of the magnetic head, logic adapted for receiving the signal samples via the magnetic head, and buffer storage memory adapted for storing the first block of signal samples, the second block of signal samples, branch metric calculations for the detection algorithm associated with the first block of signal samples, and branch metric calculations for the detection algorithm associated with the second block of signal samples.

Referring now to FIG. 10, another embodiment of a soft detecting/soft decoding system is shown. In this embodiment relying on SW-DMAX, both the forward pass FL0 and backward pass RL0 of the detection algorithm may be executed three times during a single time interval t. Then, the LDPC engine may perform decoding to produce soft information for use in the second forward pass FL1 and backward pass RL1 of the detection algorithm. This may then be repeated for a second codeword during the time interval t. This embodiment may use two forward engines (FL0 and FL1), two reverse engines (RL0 and RL1), one LDPC hardware engine, three buffers to store $y_1^{(1)}, \ldots, y_N^{(1)}, y_1^{(2)}, \ldots, y_N^{(2)},$ and $y_1^{(3)}, \ldots, y_N^{(3)}$, and three buffers adapted to store branch metric calculations. Note that, compared to method described in FIG. 9, the timing constraints for LDPC decoding here are relaxed further.

Referring now to FIGS. 4 and 10, according to one example, a tape drive system 400 comprises a soft detector 402 and a soft decoder 404. The soft detector 402 comprises logic, implemented in a first hardware engine FL0, adapted for executing a first forward loop of a detection algorithm on a first block of signal samples during a first time interval (shown as leftmost FL0+RL0), logic implemented in a second hardware engine RL0 adapted for executing a first reverse loop of the detection algorithm on the first block dining the first time interval FL0+RL0, logic implemented in a fourth hardware engine FL1 adapted for executing a second forward loop of the detection algorithm on the first block during a third time interval using second soft information 410, and logic implemented in a fifth hardware engine RL1 adapted for executing a second reverse loop of the detection algorithm on the first block during the third time interval using the second soft information 410. The soft detector 402 passes first soft information 408 to the soft decoder 404 based on the executing of the first forward and reverse loops of the detection algorithm on the first block FL0+RL0. Also, the soft detector 402 passes third soft information 408 to the soft decoder 404 based on the executing of the second forward and reverse loops of the detection algorithm on the first block FL1+RL1.

The soft decoder 404 comprises logic, implemented in a third hardware engine LDPC, adapted for executing a decoding algorithm on the first block during a second tune interval (shown as the leftmost LDPC in the upper sequence) using the first soft information and for executing the decoding algorithm on the first block during a fourth time interval (shown as the middle LDPC in the upper sequence) using the third soft information. Also, the soft decoder 404 produces the second soft information 410 based on the executing of the decoding algorithm on the first block during the second time interval. The system 400 also includes logic adapted for outputting a first decoded block of signal samples 412 based on the executing the decoding algorithm on the first block during the fourth time interval. A sum of the second, third, and fourth time intervals are about equal in duration to twice the first time interval.

In a further approach, the second time interval (shown as leftmost LDPC in upper sequence) may be about ½ of the first tune interval (shown as leftmost FL0+RL0 in upper sequence) and occurs immediately subsequent to the first time interval, the third time interval (shown as leftmost FL1+RL1 in upper sequence) may be about equal to the first time interval and occurs immediately subsequent to the second time interval, and the fourth time interval (shown as middle LDPC in upper sequence) may be about ½ of the first time interval and occurs immediately subsequent to the third time interval.

In another approach, the first hardware engine (FL0 in middle sequence) may begin executing the first forward loop and the second hardware engine (RL0 in middle sequence) may begin executing the first reverse loop of the detection algorithm on a second block of signal samples immediately subsequent to the executing of the first forward and reverse loops of the detection algorithm on the first block (FL0+RL0 in upper sequence), and the first hardware engine (FL0 in lower sequence) may begin executing the first forward loop and the second hardware engine (RL0 in lower sequence) may begin executing the first reverse loop of the detection algorithm on a third block of signal samples immediately subsequent to the executing of the first forward and reverse loops of the detection algorithm on the second block.

In a further embodiment, the system may include a magnetic head, a drive mechanism adapted for passing a magnetic medium over the magnetic head, a controller electrically coupled to the magnetic head, the controller being adapted for controlling operation of the magnetic head, logic adapted for receiving the signal samples via the magnetic head, and buffer storage memory adapted for storing the first block of signal samples, the second block of signal samples, the third block of signal samples, branch metric calculations for the detection algorithm associated with the first block of signal samples, branch metric calculations for the detection algorithm associated with the second block of signal samples, and branch metric calculations for the detection algorithm associated with the third block of signal samples.

In one approach, the detection algorithm may be a SW-DMAX algorithm and the decoding algorithm may comprise a LDPC decoding algorithm.

Figure 11:
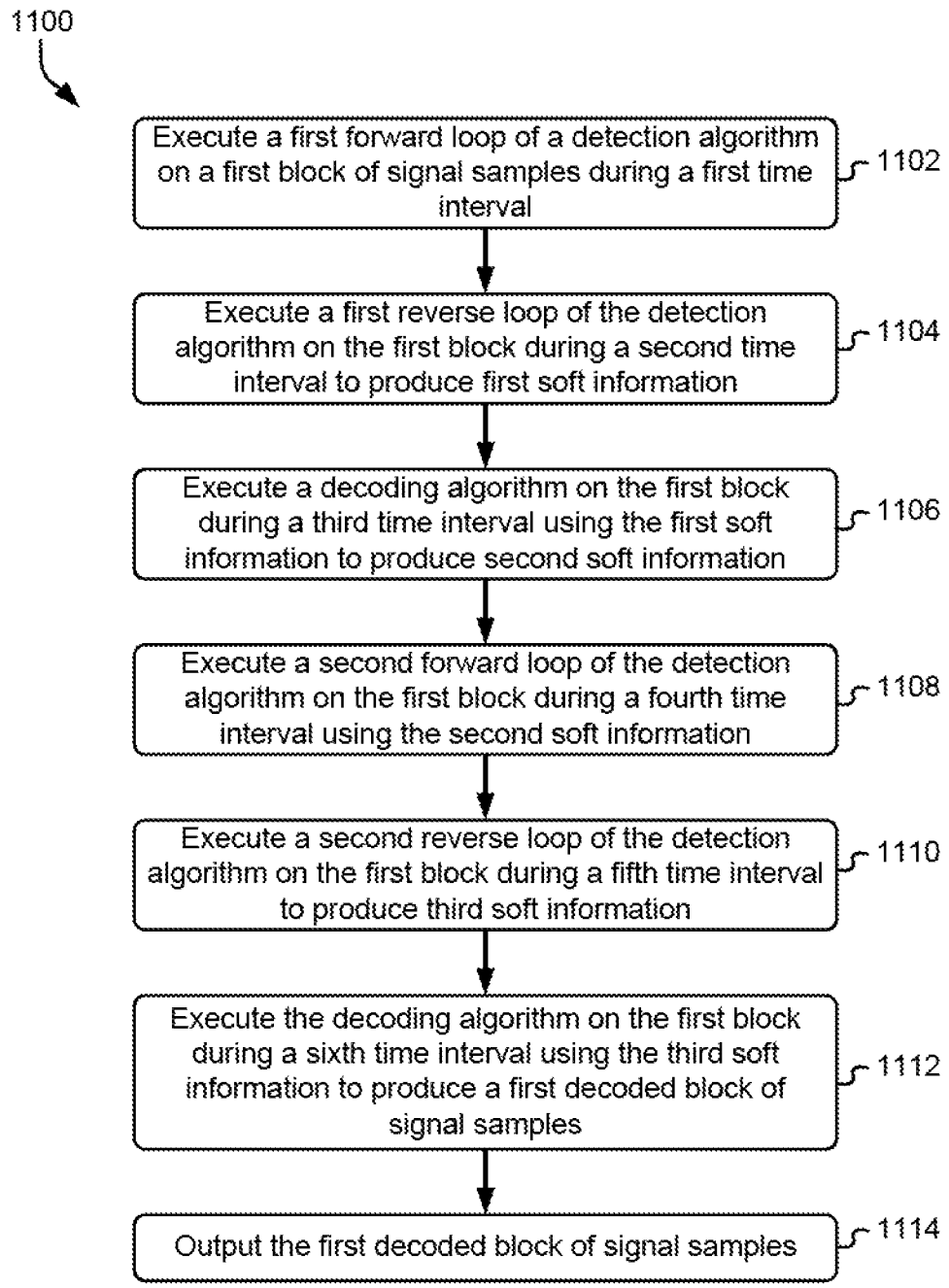
FIG. 11 is a flowchart of a method, according to one embodiment.

FIG. 11 illustrates a method 1100 according to one embodiment. As an option, the present method 1100 may be implemented in the context of the functionality and architecture of FIGS. 1-10. However, method 1100 may be carried out in any desired environment. It should be noted that the aforementioned definitions may apply during the present description, and that method 1100 may include more or less operations than those described herein, according to various embodiments.

In one embodiment, the method 1100 initiates at operation 1102, where a first forward loop of a detection algorithm is executed on a first block of signal samples during a first time interval.

In operation 1104, a first reverse loop of the detection algorithm is executed on the first block during a second time interval to produce first soft information.

In operation 1106, a decoding algorithm is executed on the first block during a third time interval using the first soft information to produce second soft information.

In operation 1108, a second forward loop of the detection algorithm is executed on the first block during a fourth time interval using the second soft information.

In operation 1110, a second reverse loop of the detection algorithm is executed on the first block during a fifth time interval to produce third soft information.

In operation 1112, the decoding algorithm is executed on the first block during a sixth time interval using the third soft information to produce a first decoded block of signal samples.

In operation 1114, the first decoded block of signal samples is output, such as by sending, transferring, displaying, or storing the first decoded block of signal samples, as would be known to one of skill in the art.

According to one embodiment, a sum of the second, third, fourth, fifth, and sixth time intervals may be about equal in duration to the first time interval, the second time interval may occur immediately subsequent to the first time interval, the third time interval may occur immediately subsequent to the second time interval, the fourth time interval may occur immediately subsequent to the third time interval, the fifth time interval may occur immediately subsequent to the fourth time interval, and the sixth time interval may occur immediately subsequent to the fifth time interval.

In a further embodiment, the method 1100 may further comprise executing the first forward loop of the detection algorithm on a second block of signal samples contemporaneous with the second, third, fourth, fifth, and sixth time intervals.

According to another embodiment, a sum of the second, third, fourth, fifth, and sixth time intervals may be about equal in duration to twice the first time interval, the second time interval may occur immediately subsequent to the first time interval, the third time interval may occur immediately subsequent to the second time interval, the fourth time interval may occur immediately subsequent to the third time interval, the fifth time interval may occur immediately subsequent to the fourth time interval, and the sixth time interval may occur immediately subsequent to the fifth time interval.

In a further embodiment, the method 1100 may further comprise executing the first forward loop of the detection algorithm on a second block of signal samples immediately subsequent to the executing the first forward loop of the detection algorithm on the first block and executing the first forward loop of the detection algorithm on a third block of signal samples immediately subsequent to the executing the first forward loop of the detection algorithm on the second block.

In another embodiment, the detection algorithm may be a DMAX or SW-DMAX detection algorithm or any other detection algorithm known in the art. According to another embodiment, the decoding algorithm may comprise a LDPC decoding algorithm or any other decoding algorithm suitable for the signal samples known in the art.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A tape drive system, comprising:
   a soft detector, comprising:
      logic, implemented in a first hardware engine, adapted for executing a first forward loop of a detection algorithm on a first block of signal samples during a first time interval;
      logic, implemented in a second hardware engine, adapted for executing a first reverse loop of the detection algorithm on the first block during a second time interval and for executing a second reverse loop of the detection algorithm on the first block during a fifth time interval;
      logic, implemented in a fourth hardware engine, adapted for executing a second forward loop of the detection algorithm on the first block during a fourth time interval using second soft information, wherein the soft detector passes first soft information to a soft decoder based on the executing of the first forward and reverse loops, and wherein the soft detector passes third soft information to the soft decoder based on the executing of the second forward and reverse loops;

the soft decoder, comprising:

logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm during the third time interval; and logic adapted for outputting a first decoded block of signal samples based on the executing the decoding algorithm on the first block during the sixth time interval, wherein a sum of the second, third, fourth, fifth, and sixth time intervals are about equal in duration to the first time interval.

2. The tape drive system as recited in claim 1, wherein the second time interval is about ¼ of the first time interval and occurs immediately subsequent to the first time interval, wherein the third time interval is about ⅛ of the first time interval and occurs immediately subsequent to the second time interval, wherein the fourth time interval is about ¼ of the first time interval occurs immediately subsequent to the third time interval, wherein the fifth time interval is about ¼ of the first time interval and occurs immediately subsequent to the fourth time interval, and wherein the sixth time interval is about ⅛ of the first time interval and occurs immediately subsequent to the fifth time interval.

3. The tape drive system as recited in claim 1, wherein the first hardware engine executes the first forward loop of the detection algorithm on a second block of signal samples contemporaneous with the second, third, fourth, fifth, and sixth time intervals.

4. The tape drive system as recited in claim 3, further comprising:

a magnetic head;

a drive mechanism adapted for passing a magnetic medium over the magnetic head;

a controller electrically coupled to the magnetic head, the controller being adapted for controlling operation of the magnetic head;

logic adapted for receiving the signal samples via the magnetic head; and buffer storage memory adapted for storing:

the first block of signal samples;

the second block of signal samples;

branch metric calculations for the detection algorithm associated with the first block of signal samples; and branch metric calculations for the detection algorithm associated with the second block of signal samples.

5. A tape drive system, comprising:

a soft detector, comprising:

logic, implemented in a first hardware engine, adapted for executing a first forward loop of a detection algorithm on a first block of signal samples during a first time interval;

logic, implemented in a second hardware engine, adapted for executing a first reverse loop of the detection algorithm on the first block of signal samples during the first time interval to produce first soft information;

logic, implemented in a third hardware engine, adapted for executing a second forward loop of the detection algorithm on the first block during a third time interval; and logic, implemented in a fourth hardware engine, adapted for executing a second reverse loop of the detection algorithm on the first block during the third time interval to produce third soft information;

a soft decoder, comprising logic, implemented in a fifth hardware engine, adapted for executing a decoding algorithm on the first block during a second time interval using the first soft information to produce the second soft information and for executing the decoding algorithm on the first block during a fourth time interval using the third soft information; and logic adapted for outputting a first decoded block of signal samples based on the executing the decoding algorithm on the first block during the fourth time interval using the third soft information, wherein a sum of the second, third, and fourth time intervals are about equal in duration to the first time interval.

6. The tape drive system as recited in claim 5, wherein the second time interval is about ⅓ of the first time interval and occurs immediately subsequent to the first time interval, wherein the third time interval is about ⅓ of the first time interval and occurs immediately subsequent to the second time interval, and wherein the fourth time interval is about ⅓ of the first time interval and occurs immediately subsequent to the third time interval.

7. The tape drive system as recited in claim 5, wherein the first hardware engine executes the first forward loop and the second hardware engine executes the first reverse loop of the detection algorithm on a second block of signal samples contemporaneous with the second, third, and fourth time intervals.

8. The tape drive system as recited in claim 7, further comprising:

a magnetic head;

a drive mechanism adapted for passing a magnetic medium over the magnetic head;

a controller electrically coupled to the magnetic head, the controller being adapted for controlling operation of the magnetic head;

logic adapted for receiving the signal samples via the magnetic head; and buffer storage memory adapted for storing:

the first block of signal samples;

the second block of signal samples;

branch metric calculations for the detection algorithm associated with the first block of signal samples; and branch metric calculations for the detection algorithm associated with the second block of signal samples.

9. The tape drive system as recited in claim 5, wherein the detection algorithm is a sliding window dual-max algorithm (SW-DMAX) and the decoding algorithm is a low-density parity check (LDPC) decoding algorithm.

10. A tape drive system, comprising:
   a soft detector, comprising:
      logic, implemented in a first hardware engine, adapted for executing a first forward loop of a detection algorithm on a first block of signal samples during a first time interval;
      logic, implemented in a second hardware engine, adapted for executing a first reverse loop of the detection algorithm on the first block during a second time interval;
      logic, implemented in a fourth hardware engine, adapted for executing a second forward loop of the detection algorithm on the first block during a fourth time interval using second soft information; and
      logic, implemented in a fifth hardware engine, adapted for executing a second reverse loop of the detection algorithm on the first block during a fifth time interval using the second soft information,
      wherein the soft detector passes first soft information to a soft decoder based on the executing of the first forward and reverse loops of the detection algorithm on the first block, and
      wherein the soft detector passes third soft information to the soft decoder based on the executing of the second forward and reverse loops of the detection algorithm on the first block;
   the soft decoder, comprising:
      logic, implemented in a third hardware engine, adapted for executing a decoding algorithm on the first block during a third time interval using the first soft information and for executing the decoding algorithm on the first block during a sixth time interval using the third soft information, wherein the soft decoder produces the second soft information based on the executing of the decoding algorithm on the first block during the third time interval; and
      logic adapted for outputting a first decoded block of signal samples based on the executing the decoding algorithm on the first block during the sixth time interval,
   wherein a sum of the second, third, fourth, fifth, and sixth time intervals are about equal in duration to twice the first time interval.

11. The tape drive system as recited in claim 10,
   wherein the second time interval is about ½ of the first time interval and occurs immediately subsequent to the first time interval,
   wherein the third time interval is about ¼ of the first time interval and occurs immediately subsequent to the second time interval,
   wherein the fourth time interval is about ½ of the first time interval and occurs immediately subsequent to the third time interval,
   wherein the fifth time interval is about ½ of the first time interval and occurs immediately subsequent to the fourth time interval, and
   wherein the sixth time interval is about ¼ of the first time interval and occurs immediately subsequent to the fifth time interval.

12. The tape drive system as recited in claim 10, wherein the first hardware engine begins executing the first forward loop of the detection algorithm on a second block of signal samples immediately subsequent to the executing the first forward loop of the detection algorithm on the first block, and wherein the first hardware engine begins executing the first forward loop of the detection algorithm on a third block of signal samples immediately subsequent to the executing the first forward loop of the detection algorithm on the second block.

13. The tape drive system as recited in claim 12, further comprising:
   a magnetic head;
   a drive mechanism adapted for passing a magnetic medium over the magnetic head;
   a controller electrically coupled to the magnetic head, the controller being adapted for controlling operation of the magnetic head;
   logic adapted for receiving the signal samples via the magnetic head; and
   buffer storage memory adapted for storing:
      the first block of signal samples;
      the second block of signal samples;
      the third block of signal samples;
      branch metric calculations for the detection algorithm associated with the first block of signal samples;
      branch metric calculations for the detection algorithm associated with the second block of signal samples; and
      branch metric calculations for the detection algorithm associated with the third block of signal samples.

14. A tape drive system, comprising:
   a soft detector, comprising:
      logic, implemented in a first hardware engine, adapted for executing a first forward loop of a detection algorithm on a first block of signal samples during a first time interval;
      logic, implemented in a second hardware engine, adapted for executing a first reverse loop of the detection algorithm on the first block during the first time interval;
      logic, implemented in a fourth hardware engine, adapted for executing a second forward loop of the detection algorithm on the first block during a third time interval using second soft information; and
      logic, implemented in a fifth hardware engine, adapted for executing a second reverse loop of the detection algorithm on the first block during the third time interval using the second soft information,
      wherein the soft detector passes first soft information to a soft decoder based on the executing of the first forward and reverse loops of the detection algorithm on the first block, and
      wherein the soft detector passes third soft information to the soft decoder based on the executing of the second forward and reverse loops of the detection algorithm on the first block;
   the soft decoder, comprising:
      logic, implemented in a third hardware engine, adapted for executing a decoding algorithm on the first block during a second time interval using the first soft information and for executing the decoding algorithm on the first block during a fourth time interval using the third soft information, wherein the soft decoder produces the second soft information based on the executing of the decoding algorithm on the first block during the second time interval; and
      logic adapted for outputting a first decoded block of signal samples based on the executing the decoding algorithm on the first block during the fourth time interval,
   wherein a sum of the second, third, and fourth time intervals are about equal in duration to twice the first time interval.

15. The tape drive system as recited in claim 14,
wherein the second time interval is about ½ of the first time interval and occurs immediately subsequent to the first time interval,
wherein the third time interval is about equal to the first time interval and occurs immediately subsequent to the second time interval, and
wherein the fourth time interval is about ½ of the first time interval and occurs immediately subsequent to the third time interval.

16. The tape drive system as recited in claim 14, wherein the first hardware engine begins executing the first forward loop and the second hardware engine begins executing the first reverse loop of the detection algorithm on a second block of signal samples immediately subsequent to the executing of the first forward and reverse loops of the detection algorithm on the first block, and wherein the first hardware engine begins executing the first forward loop and the second hardware engine begins executing the first reverse loop of the detection algorithm on a third block of signal samples immediately subsequent to the executing of the first forward and reverse loops of the detection algorithm on the second block.

17. The tape drive system as recited in claim 16, further comprising:
a magnetic head;
a drive mechanism adapted for passing a magnetic medium over the magnetic head;
a controller electrically coupled to the magnetic head, the controller being adapted for controlling operation of the magnetic head;
logic adapted for receiving the signal samples via the magnetic head; and
buffer storage memory adapted for storing:
the first block of signal samples;
the second block of signal samples;
the third block of signal samples;
branch metric calculations for the detection algorithm associated with the first block of signal samples;
branch metric calculations for the detection algorithm associated with the second block of signal samples; and
branch metric calculations for the detection algorithm associated with the third block of signal samples.

18. The tape drive system as recited in claim 14, wherein the detection algorithm is a sliding window dual-max algorithm (SW-DMAX) and the decoding algorithm comprises a low-density parity check (LDPC) decoding algorithm.

19. The tape drive system as recited in claim 1, wherein the second time interval occurs subsequent to the first time interval, the third time interval occurs subsequent to the second time interval, the fourth time interval occurs subsequent to the third time interval, the fifth time interval occurs subsequent to the fourth time interval, and the sixth time interval occurs subsequent to the fifth time interval.

20. The tape drive system as recited in claim 1, wherein the second time interval occurs immediately subsequent to the first time interval, the third time interval occurs immediately subsequent to the second time interval, the fourth time interval occurs immediately subsequent to the third time interval, the fifth time interval occurs immediately subsequent to the fourth time interval, and the sixth time interval occurs immediately subsequent to the fifth time interval.

21. The tape drive system as recited in claim 5, wherein the second time interval occurs subsequent to the first time interval, the third time interval occurs subsequent to the second time interval, and the fourth time interval occurs subsequent to the third time interval.

22. The tape drive system as recited in claim 5, wherein the second time interval occurs immediately subsequent to the first time interval, the third time interval occurs immediately subsequent to the second time interval, and the fourth time interval occurs immediately subsequent to the third time interval.

* * * * *